(12) United States Patent
Utsumi et al.

(10) Patent No.: US 10,486,263 B2
(45) Date of Patent: Nov. 26, 2019

(54) ROOM-TEMPERATURE-BONDED SEMICONDUCTOR DEVICE AND MANUFACTURING METHOD OF ROOM-TEMPERATURE-BONDED SEMICONDUCTOR DEVICE

(71) Applicant: MITSUBISHI HEAVY INDUSTRIES MACHINE TOOL CO., LTD., Ritto-shi, Shiga (JP)

(72) Inventors: Jun Utsumi, Tokyo (JP); Takayuki Goto, Tokyo (JP); Takenori Suzuki, Tokyo (JP); Kensuke Ide, Tokyo (JP)

(73) Assignee: MITSUBISHI HEAVY INDUSTRIES MACHINE TOOL CO., LTD., Shiga (JP)

( * ) Notice: Subject to any disclaimer, the term of this patent is extended or adjusted under 35 U.S.C. 154(b) by 0 days.

(21) Appl. No.: 15/537,646

(22) PCT Filed: Oct. 7, 2015

(86) PCT No.: PCT/JP2015/078518
§ 371 (c)(1),
(2) Date: Jun. 19, 2017

(87) PCT Pub. No.: WO2016/103846
PCT Pub. Date: Jun. 30, 2016

(65) Prior Publication Data
US 2017/0355040 A1    Dec. 14, 2017

(30) Foreign Application Priority Data
Dec. 22, 2014   (JP) .................. 2014-259115

(51) Int. Cl.
*H01L 21/447*   (2006.01)
*H01L 21/603*   (2006.01)
(Continued)

(52) U.S. Cl.
CPC .............. *B23K 20/02* (2013.01); *B23K 20/00* (2013.01); *B23K 20/22* (2013.01); *B32B 37/14* (2013.01);
(Continued)

(58) Field of Classification Search
CPC ............................. H01L 23/525–5258; H01L 2224/0212–2224/02122;
(Continued)

(56) References Cited

U.S. PATENT DOCUMENTS 5,985,412 A * 11/1999 Gosele ................ B81C 1/00293
                                                      156/281
6,265,244 B1 * 7/2001 Hayashi .................. H01L 24/11
                                                      257/E21.508
(Continued)

FOREIGN PATENT DOCUMENTS

CN    102782850 A    11/2012
CN    103460339 A    12/2013
(Continued)

OTHER PUBLICATIONS

English translation of the International Preliminary Report on Patentability (Form PCT/IPEA/409) for International Application No. PCT/JP2015/078518, dated Apr. 28, 2017.
(Continued)

*Primary Examiner* — Maliheh Malek
(74) *Attorney, Agent, or Firm* — Birch, Stewart, Kolasch & Birch, LLP

(57) ABSTRACT

Provided is a semiconductor device formed by performing bonding at room temperature with respect to a wafer in which bonded electrodes and insulating layers and are respectively exposed to front surfaces, including a bonding interlayer which independently exhibits non-conductivity (Continued)

and exhibits conductivity by being bonded to the bonded electrodes, between the front surfaces.

9 Claims, 12 Drawing Sheets

(51) Int. Cl.

| | |
|---|---|
| *H01L 23/498* | (2006.01) |
| *B23K 20/02* | (2006.01) |
| *B23K 20/00* | (2006.01) |
| *H01L 21/02* | (2006.01) |
| *B23K 20/22* | (2006.01) |
| *B32B 37/14* | (2006.01) |
| *B81C 3/00* | (2006.01) |
| *H01L 21/20* | (2006.01) |
| *H01L 21/18* | (2006.01) |

(52) U.S. Cl.
CPC .............. *B81C 3/001* (2013.01); *H01L 21/02* (2013.01); *H01L 21/187* (2013.01); *H01L 21/2007* (2013.01); *H01L 23/49827* (2013.01); *H01L 23/49833* (2013.01); *H01L 2224/05572* (2013.01); *H01L 2224/80895* (2013.01); *H01L 2924/0002* (2013.01); *H01L 2924/15787* (2013.01)

(58) Field of Classification Search
CPC ... H01L 2224/02163; H01L 2224/0218; H01L 2224/0219; H01L 2224/03; H01L 2224/03011; H01L 2224/03013; H01L 2224/0312; H01L 2224/033; H01L 2224/034; H01L 2224/03444–03452; H01L 2224/0352–03552; H01L 2224/0363; H01L 2224/04026; H01L 2224/05011; B23K 20/021; B23K 20/22; B23K 20/233; B23K 20/23333; B23K 20/2336; B23K 20/24; B23K 20/26

See application file for complete search history.

(56) References Cited

U.S. PATENT DOCUMENTS

| | | | | |
|---|---|---|---|---|
| 6,281,039 B1* | 8/2001 | Marion | ............... | H01L 24/24 257/E21.511 |
| 7,208,392 B1* | 4/2007 | Jaussaud | ............. | H01L 21/0445 257/E21.054 |
| 8,906,175 B2* | 12/2014 | Kinouchi | ............... | B23K 20/02 156/285 |
| 8,975,156 B2* | 3/2015 | Pocas | ............... | H01L 21/187 257/341 |
| 9,130,000 B2* | 9/2015 | Tsuno | ............... | B23K 17/00 |
| 9,190,345 B1* | 11/2015 | Chen | ............... | H01L 21/76877 |
| 9,443,711 B2* | 9/2016 | Kinouchi | ............... | H01L 21/67092 |
| 9,812,428 B2* | 11/2017 | Luo | ............... | H01L 25/0657 |
| 2001/0006846 A1* | 7/2001 | Cao | ............... | H01L 21/2007 438/618 |
| 2002/0003307 A1 | 1/2002 | Suga | | |
| 2005/0056074 A1* | 3/2005 | Meng | ............... | B81C 1/00619 72/352 |
| 2005/0170626 A1 | 8/2005 | Suga | | |
| 2005/0238278 A1* | 10/2005 | Nakashiba | ............... | B32B 15/08 385/14 |
| 2007/0072391 A1* | 3/2007 | Pocas | ............... | H01L 21/187 438/455 |
| 2007/0128825 A1* | 6/2007 | Suga | ............... | H01L 21/187 438/455 |
| 2007/0200173 A1* | 8/2007 | Pelley, III | ............... | H01L 21/84 257/347 |
| 2008/0041517 A1* | 2/2008 | Moriceau | ............... | H01L 24/83 156/182 |
| 2008/0245843 A1* | 10/2008 | Suga | ............... | B23K 20/023 228/3.1 |
| 2008/0251201 A1* | 10/2008 | Sikkel | ............... | C08J 5/121 156/330 |
| 2008/0286952 A1* | 11/2008 | Miyairi | ............. | H01L 21/76254 438/517 |
| 2009/0072408 A1* | 3/2009 | Kabir | ............... | B82Y 10/00 257/773 |
| 2010/0000663 A1* | 1/2010 | Goto | ............... | B23K 20/02 156/151 |
| 2010/0092786 A1 | 4/2010 | Utsumi et al. | | |
| 2010/0201735 A1* | 8/2010 | Sato | ............... | B41J 2/161 347/20 |
| 2011/0134235 A1* | 6/2011 | Tsumura | ........... | H01L 21/67005 348/87 |
| 2011/0207291 A1* | 8/2011 | Tsuno | ............... | B23K 17/00 438/455 |
| 2011/0215407 A1* | 9/2011 | Tang | ............... | H01L 21/76254 257/348 |
| 2011/0227068 A1* | 9/2011 | Akiyama | .......... | H01L 21/76254 257/43 |
| 2011/0277904 A1* | 11/2011 | Kinouchi | ............... | B23K 20/02 156/60 |
| 2012/0119323 A1* | 5/2012 | Akiyama | ............... | H01L 21/265 257/507 |
| 2013/0037942 A1* | 2/2013 | Hwang | ............ | H01L 21/76898 257/737 |
| 2013/0112334 A1* | 5/2013 | Tsuno | ............... | H01L 21/67092 156/64 |
| 2014/0036177 A1* | 2/2014 | Zhang | ............... | G02F 1/1354 349/25 |
| 2014/0037945 A1* | 2/2014 | Suga | ............... | B23K 1/20 428/336 |
| 2014/0048805 A1* | 2/2014 | Suga | ............... | B23K 1/20 257/51 |
| 2014/0138853 A1* | 5/2014 | Liu | ............... | B81C 1/00269 257/777 |
| 2014/0224405 A1* | 8/2014 | Kinouchi | ............... | H01L 21/67092 156/64 |
| 2014/0263586 A1* | 9/2014 | Huang | ............... | B23K 1/206 228/206 |
| 2015/0048509 A1* | 2/2015 | Nagarajan | ............. | H01L 21/185 257/751 |
| 2015/0064810 A1* | 3/2015 | Liu | ............... | H01L 21/3065 438/9 |
| 2015/0125659 A1* | 5/2015 | Fujiyama | ............... | G02B 1/118 428/141 |
| 2015/0155165 A1* | 6/2015 | Hata | ............... | H01L 21/2007 257/623 |
| 2015/0162294 A1* | 6/2015 | Kawasaki | ............... | H01L 24/24 257/773 |
| 2015/0200129 A1* | 7/2015 | Konishi | ............ | H01L 21/76254 257/506 |
| 2015/0233698 A1* | 8/2015 | Huang | ............... | H01L 24/05 324/691 |
| 2015/0249026 A1* | 9/2015 | Tsuno | ............... | C23C 14/3407 156/151 |
| 2015/0251904 A1* | 9/2015 | Kinouchi | ............... | B23K 20/008 156/272.2 |
| 2015/0262862 A1* | 9/2015 | Kawai | ............... | B82Y 30/00 257/506 |
| 2015/0270172 A1* | 9/2015 | Purushotannan | ............... | H01L 21/76898 438/108 |
| 2015/0294900 A1* | 10/2015 | Goto | ............... | B23K 15/0006 428/620 |
| 2015/0294955 A1* | 10/2015 | Chen | ............... | H01L 25/0657 257/777 |
| 2016/0031035 A1* | 2/2016 | Katoh | ............... | C22C 38/54 228/193 |
| 2016/0035702 A1* | 2/2016 | Luo | ............... | H01L 25/0657 257/754 |
| 2016/0071959 A1* | 3/2016 | Thomas | ............ | H01L 29/66833 257/324 |
| 2016/0181228 A1* | 6/2016 | Higuchi | ............... | H01L 25/07 257/774 |

(56) References Cited

U.S. PATENT DOCUMENTS

| | | | |
|---|---|---|---|
| 2016/0190103 A1* | 6/2016 | Kabe | H01L 24/06 257/777 |
| 2016/0250838 A1 | 9/2016 | Utsumi et al. | |
| 2016/0379963 A1* | 12/2016 | Tsai | H01L 21/76898 257/774 |
| 2017/0162428 A1* | 6/2017 | Kinouchi | H01L 21/68785 |
| 2017/0179029 A1* | 6/2017 | Enquist | H01L 21/76838 |
| 2017/0186800 A1* | 6/2017 | Ikeda | H01L 27/14634 |
| 2017/0194351 A1* | 7/2017 | Tang | H01L 27/1203 |
| 2017/0213761 A1* | 7/2017 | Tang | H01L 27/108 |
| 2017/0221705 A1* | 8/2017 | Matsuo | H01L 21/02529 |
| 2017/0323869 A1* | 11/2017 | Chen | H01L 25/0657 |
| 2018/0068965 A1* | 3/2018 | Chen | H01L 21/324 |

FOREIGN PATENT DOCUMENTS

| | | | |
|---|---|---|---|
| JP | 1-133341 | A | 5/1989 |
| JP | 6-84733 | A | 3/1994 |
| JP | 10-92702 | A | 4/1998 |
| JP | 10-256263 | A | 9/1998 |
| JP | 3440057 | B2 | 8/2003 |
| JP | 4162094 | B2 | 10/2008 |
| JP | 2012-238729 | A | 12/2012 |
| KR | 10-2014-00538 | A2 | 5/2014 |

OTHER PUBLICATIONS

Korean Office Action, dated Sep. 18, 2018, for corresponding Korean Application No. 10-2017-7017033, with an English translation.

* cited by examiner

- 22(SiO$_2$)
- 30(30a)(a-Si)
- BONDING INTERFACE
- 25(SiO$_2$)

- 23(Cu)
- 30(30b)(a-Si)
- BONDING INTERFACE
- 26(Cu)

ROOM-TEMPERATURE-BONDED SEMICONDUCTOR DEVICE AND MANUFACTURING METHOD OF ROOM-TEMPERATURE-BONDED SEMICONDUCTOR DEVICE

FIELD

The present invention relates to a semiconductor device formed by joining a plurality of substrates together, and a manufacturing method of a semiconductor device.

BACKGROUND

Recently, a three-dimensional integration technology of laminating the same or different types of semiconductor devices has attracted attention with respect to high integration of a semiconductor device. In such a three-dimensional integration technology, a technology of joining junction surfaces of substrates together to which conductive materials formed of an electrode or wiring and insulating materials are exposed, is important. In general, bonding at room temperature is known as a bonding technology of two substrates. The bonding method at room temperature is a technology of performing bonding by activating surfaces of two substrates to be joined together in a vacuum atmosphere, and by performing pressure-welding with respect to the activated surfaces. In the bonding method at room temperature, it is possible to directly join the bonded materials (the substrates) together without requiring a heat treatment. For this reason, there is an advantage in that it is possible to suppress deformation such as expansion of the substrate according to the heat treatment, and to accurately align two substrates at the time of performing bonding.

However, in the bonding method at room temperature described above, it is possible to directly bond metals as the conductive material together, but it is not possible to directly bond oxide films, nitride films, or the like together, which are generally used as the insulating material. For this reason, in the related art, a bonding method at room temperature is proposed in which it is possible to simultaneously bond conductive materials and insulating materials together by using a trace metal which is attached onto a bonded surface (hybrid bonding) (for example, refer to Patent Literature 1).

CITATION LIST

Patent Literature

Patent Literature 1: Japanese Patent No. 4162094

SUMMARY

Technical Problem

However, a plurality of fine conductive materials (electrodes) are formed on the bonded surface of the substrate, and thus, in the bonded method of the related art, a leak current is generated between the adjacent conductive materials (electrodes) due to the metal attached onto the bonded surface, and an operational problem of the device is concerned.

The present invention has been made in consideration of the above, and an object of the present invention is to provide a semiconductor device which is capable of simultaneously bonding conductive materials and insulating materials together while preventing a leak current between the conductive materials from being generated, and a manufacturing method of a semiconductor device.

Solution to Problem

In order to solve the above problem and achieve the above object, an invention of the present application is a semiconductor device formed by performing a bonding method at room temperature with respect to a pair of substrates in which conductive materials and insulating materials are respectively exposed to bonded surfaces of semiconductor base materials. The device includes a bonding interlayer which independently exhibits non-conductivity and exhibits conductivity by being bonded to the conductive material, between the pair of bonded surfaces.

According to such a configuration, the junction interlayer is provided between the pair of bonded surfaces, and thus, it is possible to simultaneously and respectively bond the conductive materials and the insulating materials together. Further, the bonding interlayer independently exhibits the non-conductivity and exhibits the conductivity by being bonded to the conductive material, and thus, it is possible to ensure non-conductivity between the insulating materials while ensuring conductivity between the conductive materials. For this reason, it is possible to prevent a leak current from being generated between the conductive materials, and to realize a stable operation of the semiconductor device.

Furthermore, the insulating materials of the substrates may be joined together via the bonding interlayer. According to such a configuration, it is possible to rigidly join the insulating materials together.

Furthermore, the bonding interlayer may be formed of an amorphous semiconductor material. According to such a configuration, it is possible to simply form the bonding interlayer having properties in which the non-conductivity is independently exhibited and the conductivity is exhibited by being bonded to the conductive material, on the bonded surface of the substrate by performing vapor deposition, sputtering, or chemical vapor deposition with respect to the semiconductor material.

Furthermore, at least one of the substrates may be formed such that a height position of the insulating material of the bonded surface is lower than that of the conductive material. According to such a configuration, a pressure-welding load is imparted to the conductive material at the time of performing pressure-welding with respect to the substrates, and thus, the bonding interlayer is broken by the conductive material. For this reason, the conductive materials are directly bonded together, and thus, it is possible to obtain excellent electric properties and excellent bonding strength between the conductive materials.

Furthermore, an invention of the present application is a manufacturing method of a semiconductor device manufactured by performing bonding method at room temperature with respect to a pair of substrates in which conductive materials and insulating materials are respectively exposed to bonded surfaces of semiconductor base materials. The method includes the steps of respectively activating the bonded surfaces of the substrates, forming a bonding interlayer which independently exhibits non-conductivity and exhibits conductivity by being bonded to the conductive material, on at least one of the activated surfaces, and performing pressure-welding with respect to the pair of substrates via the bonding interlayer. According to such a configuration, it is possible to easily realize hybrid bonding in which the conductive materials and the insulating materials are simultaneously and respectively bonded together.

Furthermore, the bonding interlayer may be formed by vapor deposition, sputtering, or chemical vapor deposition of a semiconductor material. According to such a configuration, it is possible to simply form the bonding interlayer on the bonded surface of the substrate.

Furthermore, the semiconductor material may be sputtered by being irradiated with a fast atom beam, and thus, the bonding interlayer may be formed on the bonded surface of one substrate, and then, the bonding interlayer formed on the bonded surface may be irradiated with a fast atom beam, and a part of the semiconductor material forming the bonding interlayer may be sputtered, and thus, the bonding interlayer may be formed on the bonded surface of the other substrate. According to such a configuration, it is possible to simplify an operating procedure, and to simply form the bonding interlayer on the bonded surfaces of each of the substrates.

Furthermore, at least one of the substrates may be formed such that a height position of the insulating material of the bonded surface is lower than that of the conductive material, the bonding interlayer may be broken by the conductive material at the time of performing pressure-welding with respect to the substrates, and the conductive materials may be directly bonded together. According to such a configuration, the conductive materials are directly bonded together, and thus, it is possible to obtain excellent electric properties and excellent bonding strength between the conductive materials.

Furthermore, the manufacturing method may include a step of heating the substrates at a predetermined temperature after the pair of substrates are subjected to pressure-welding. According to such a configuration, it is possible to improve bonding strength and electric properties between the conductive materials.

Advantageous Effects of Invention

According to the present invention, it is possible to simultaneously join the conductive materials and the insulating materials together while preventing the leak current from being generated between the conductive materials.

DESCRIPTION OF EMBODIMENTS

Hereinafter, embodiments according to the present invention will be described with reference to the drawings. Furthermore, the present invention is not limited by the following embodiments. In addition, constituents of the following embodiments include a constituent which can be easily substituted by a person skilled in the art, or substantially the same constituent.

Figure 1:
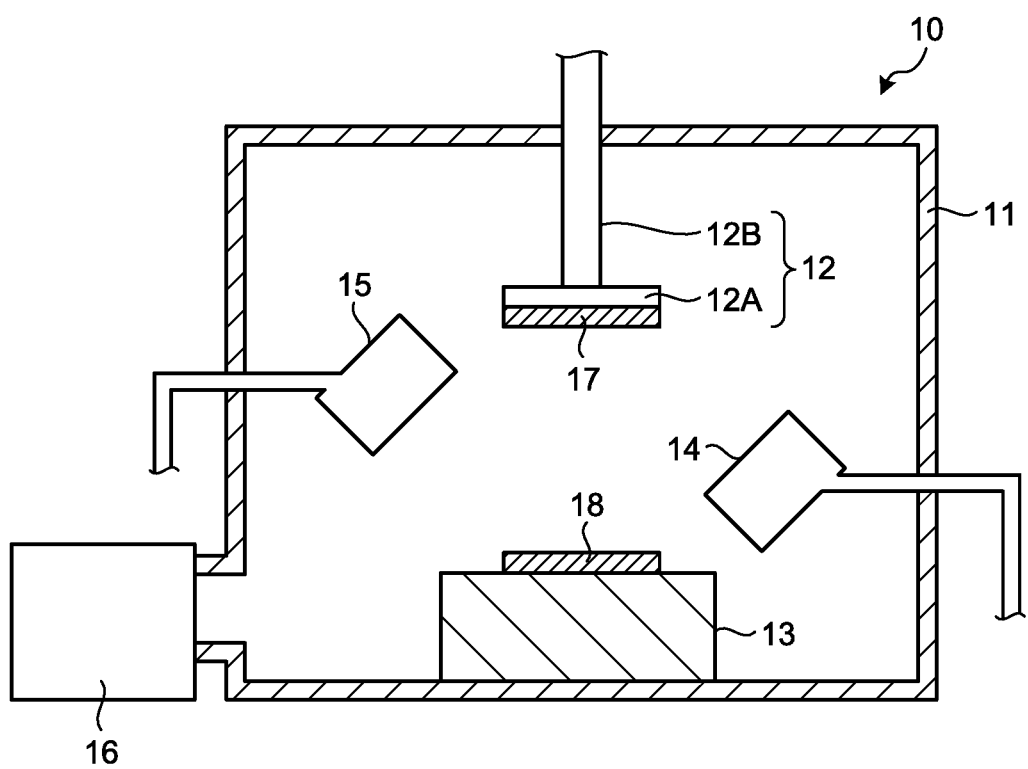
FIG. 1 is a sectional view schematically illustrating a configuration of a bonding at room temperature device to which a semiconductor device according to this embodiment is bonded.

FIG. 1 is a sectional view schematically illustrating a configuration of a bonding at room temperature device to which a semiconductor device is bonded according to this embodiment. As illustrated in FIG. 1, a bonding at room temperature device 10 includes a vacuum chamber 11, an upper side stage 12 and a lower side stage 13 which are disposed in the vacuum chamber 11, fast atom beam sources (FAB) 14 and 15, and a vacuum evacuation device 16.

The vacuum chamber 11 is a container sealing the inside from the environment, and the vacuum evacuation device 16 evacuates gas from the inside of the vacuum chamber 11. Accordingly, the inside of the vacuum chamber 11 is in a vacuum atmosphere. Further, the vacuum chamber 11 includes a gate (not illustrated) which allows an internal space of the vacuum chamber 11 to be communicated with or to be separated from the outside.

The upper side stage 12 includes an electrostatic chuck 12A formed in the shape of a disk, and a pressure-welding mechanism 12B moving the electrostatic chuck 12A up and down in a vertical direction. The electrostatic chuck 12A includes a dielectric layer on a lower end of the disk, applies a voltage to the dielectric layer, and adsorbs and supports a first wafer (a substrate) 17 on the dielectric layer by an electrostatic force. The pressure-welding mechanism 12B translates the electrostatic chuck 12A with respect to the vacuum chamber 11 in the vertical direction according to the manipulation of a user.

The lower side stage 13 is a stage supporting a second wafer (a substrate) 18 on an upper surface thereof, and includes a transport mechanism (not illustrated). The transport mechanism translates the lower side stage 13 in a horizontal direction according to the manipulation of the user, and rotatively moves the lower side stage 13 around a rotation axis which is parallel to the vertical direction. In addition, the lower side stage 13 may have a mechanism which includes a dielectric layer on an upper end thereof, applies a voltage to the dielectric layer, and adsorbs and supports the second wafer 18 on the dielectric layer by an electrostatic force.

The fast atom beam sources 14 and 15 emits a neutral atomic beam (for example, an argon Ar atom) used for activating a front surface of the wafer. One fast atom beam source 14 is disposed towards the first wafer 17 which is supported on the upper side stage 12, and the other fast atom beam source 15 is disposed towards the second wafer 18 which is supported on the lower side stage 13. The neutral atomic beam is emitted, and thus, each of the front surfaces of the first wafer 17 and the second wafer 18 is activated. In addition, other activation units (for example, an ion gun or plasma) may be used for activating each of the wafers, instead of the fast atom beam sources 14 and 15.

Figure 2:
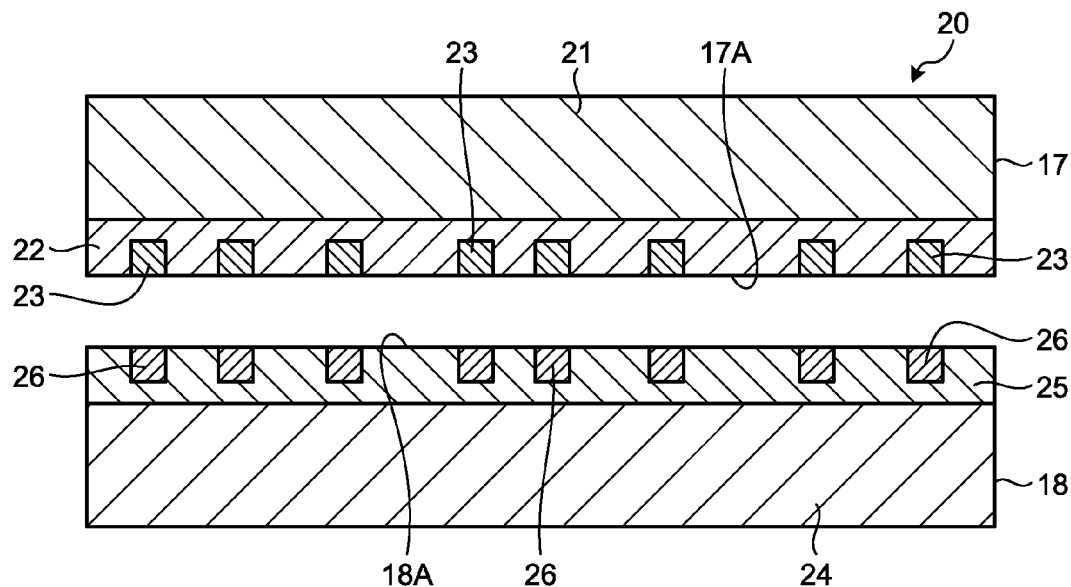
FIG. 2 is a sectional view schematically illustrating configurations of a first wafer and a second wafer before bonding.
Figure 3:
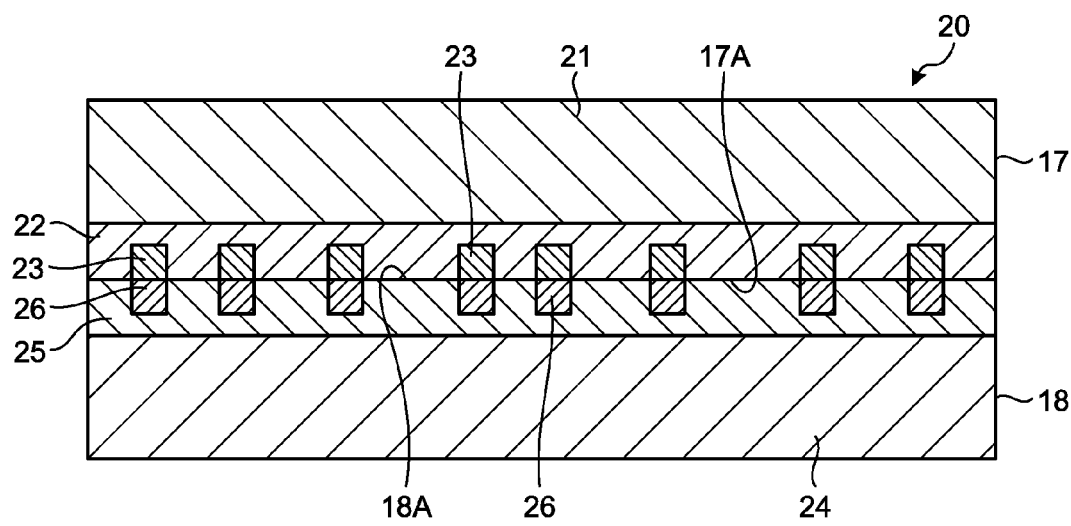
FIG. 3 is a sectional view schematically illustrating a configuration of a semiconductor device formed by bonding the first wafer and the second wafer together.

Next, a semiconductor device 20 which is subjected to bonding at room temperature by using the bonding at room temperature device 10 will be described. FIG. 2 is a sectional view schematically illustrating the configurations of the first wafer and the second wafer before bonding, and FIG. 3 is a sectional view schematically illustrating the configuration of the semiconductor device which is formed by bonding the first wafer and the second wafer together. As illustrated in FIG. 2, the first wafer 17 includes a first insulating layer (an insulating material) 22 formed by being laminated on a first semiconductor base material 21, and a first bonded electrode (a conductive material) 23 formed on a first insulating layer 22. Each of the first insulating layer 22 and the first bonded electrode 23 is formed by being exposed to a front surface 17A of the first wafer 17, and the front surface 17A bonding as a bonded surface. In addition, the second wafer 18 includes a second insulating layer (an insulating material) 25 formed by being laminated on a second semiconductor base material 24, and a second bonded electrode (a conductive material) 26 formed on a second insulating layer 25. Each of the second insulating layer 25 and the second bonded electrode 26 is formed by being exposed to a front surface 18A of the second wafer 18, and the front surface 18A functions as a bonded surface. The front surfaces 17A and 18A are formed as a flat surface, and the front surfaces 17A and 18A are closely bonded together.

In the first semiconductor base material 21 and the second semiconductor base material 24, for example, single crystal silicon (Si) is used, and materials such as single crystal germanium (Ge), gallium arsenide (GaAs) or silicon carbide (SiC) can be used. In addition, in the first semiconductor base material 21 and the second semiconductor base material 24, not only the same type of material but also different types of materials may be used.

The first insulating layer 22 and the second insulating layer 25 are formed of an oxide or a nitride of the semiconductor base material on the front surfaces 17A and 18A sides. Specifically, in a case where single crystal silicon (Si) is used as the semiconductor base material, a silicon oxide film ($SiO_2$) or a silicon nitride film ($Si_3N_4$) is formed by film formation in an oxidizing furnace, a nitriding furnace, a chemical vapor deposition (CVD) device, or the like, as the first insulating layer 22 and the second insulating layer 25. In this embodiment, the silicon oxide film ($SiO_2$) is formed. In addition, the first junction electrode 23 and the second bonded electrode 26 are formed of a material having excellent conductivity, for example, copper (Cu). A wiring material is connected to the first bonded electrode 23 and the second bonded electrode 26, and thus, an electronic circuit or various elements are formed.

Figure 4:
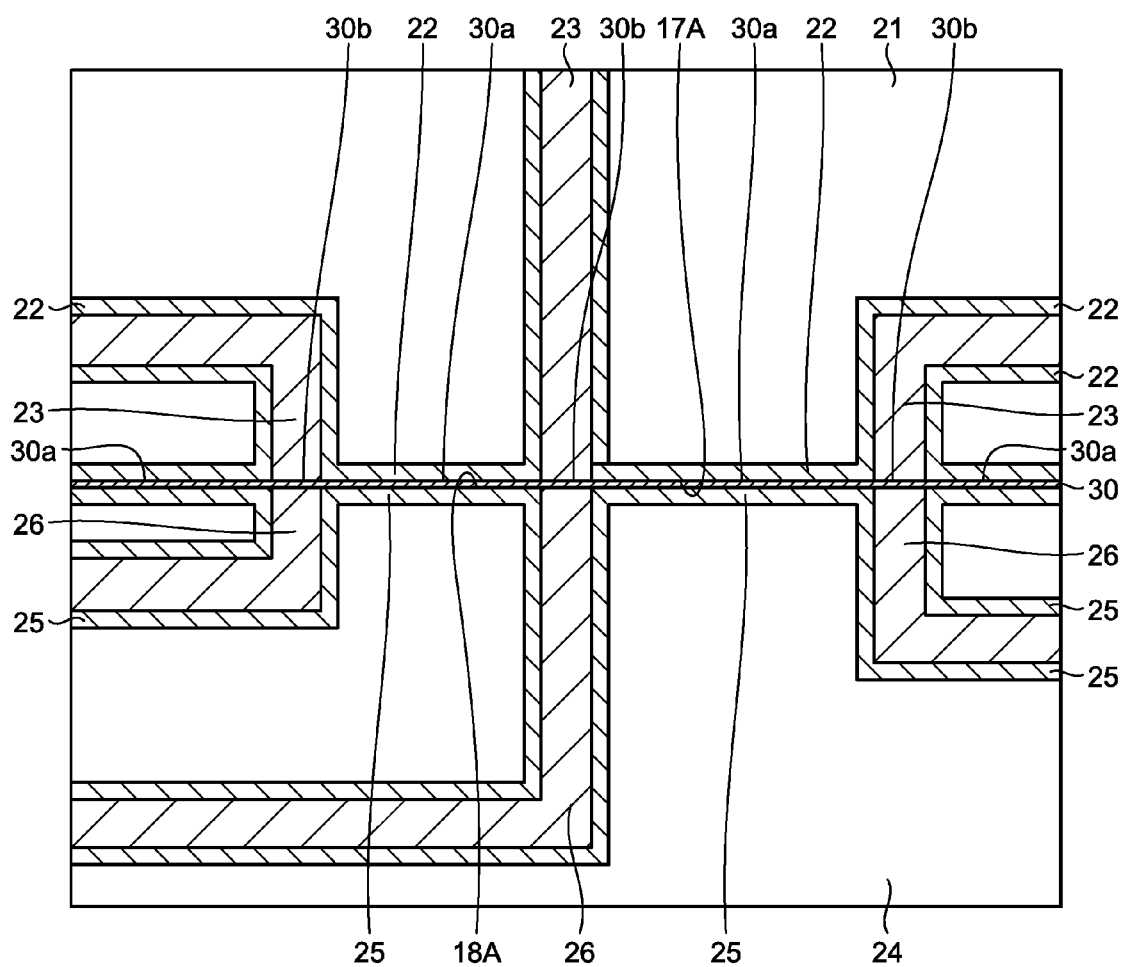
FIG. 4 is a sectional view schematically illustrating a state where the first wafer and the second wafer are bonded together.

In a case where the first wafer 17 and the second wafer 18 are bonded together, and as illustrated in FIG. 2 and FIG. 3, the front surfaces 17A and 18A as the bonded surface face each other, and the bonding at room temperature is performed by using the bonding at room temperature device 10 described above. In this case, the first bonded electrode 23 of the first wafer 17 and the second bonded electrode 26 of the second wafer 18 are bonded together, the first insulating layer 22 of the first wafer 17 and the second insulating layer 25 of the second wafer 18 are bonded together. In the bonding at room temperature, the materials of the first bonded electrode 23 and the second bonded electrode 26 are bonded together, but the first insulating layer 22 and the second insulating layer 25 are the silicon oxide film ($SiO_2$) or the silicon nitride film ($Si_3N_4$), and thus, are not able to be directly bonded together. For this reason, in this configuration, as illustrated in FIG. 4, a bonding interlayer 30 for simultaneously joining the bonded electrode and the insulating layer together is disposed between the front surface 17A of the first wafer 17 and the front surface 18A of the second wafer 18.

The bonding interlayer 30 is a thin film for bonding the front surface 17A of the first wafer 17 and the front surface 18A of the second wafer 18 together, and is formed of an amorphous semiconductor material (for example, amorphous silicon). According to the studies of the present inventors, it is determined that the amorphous semiconductor material (for example, amorphous silicon) independently (in a single body) exhibits non-conductivity, but exhibits conductivity by being bonded to metals or the like. For this reason, the amorphous semiconductor material is used as the bonding interlayer 30, and thus, it is possible to rigidly join the first insulating layer 22 and the second insulating layer 25 together while retaining non-conductivity (insulating properties) between the first insulating layer 22 and the second insulating layer 25. Further, it is possible to ensure conductivity between the first bonded electrode 23 and the second bonded electrode 26 without degrading electric properties between the first bonded electrode 23 and the second bonded electrode 26. That is, the bonding interlayer 30 is formed by including a region (an insulating bonded portion 30a) which bonds the first insulating layer 22 and the second insulating layer 25 together while retaining the non-conductivity (the insulating properties), and a region (a conductive junction portion 30b) which has conductivity and bonds the first bonded electrode 23 and the second bonded electrode 26 together.

Figure 5:
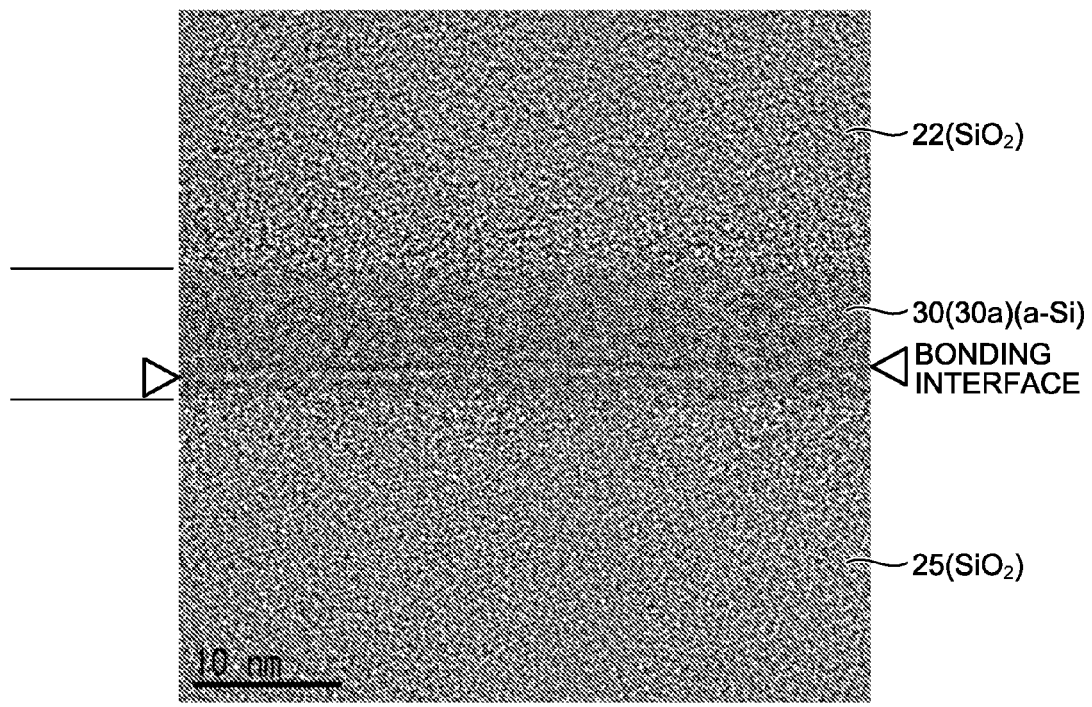
FIG. 5 is a transmission electron microscope photograph illustrating a bonding interface of $SiO_2/SiO_2$ as an insulating layer.
Figure 6:
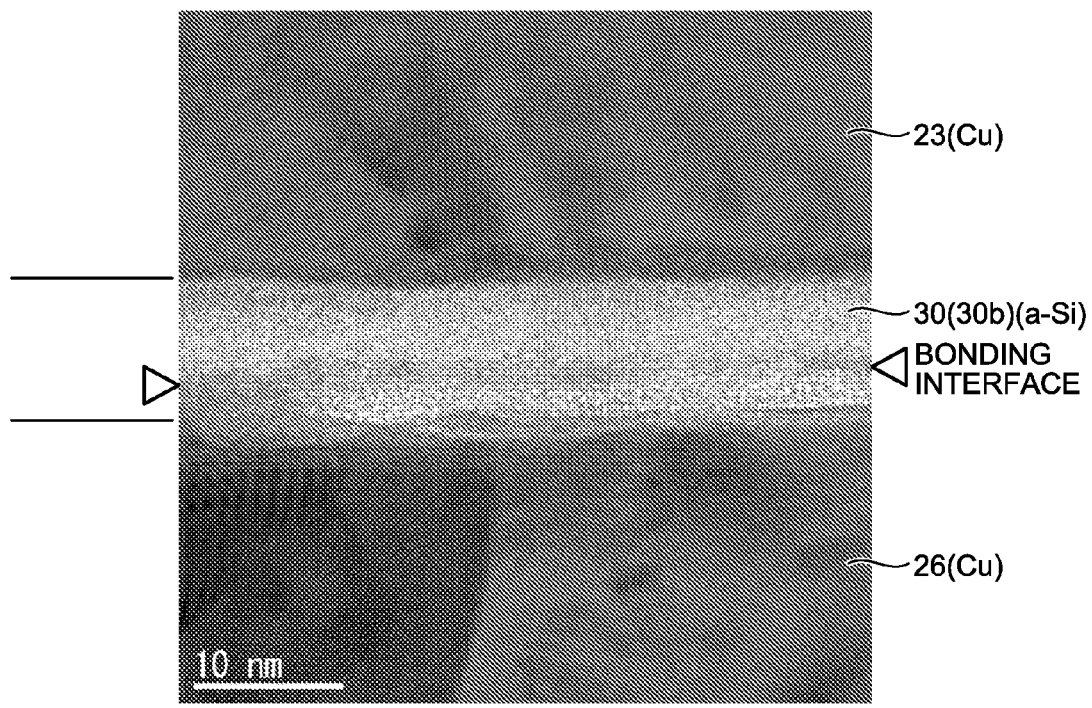
FIG. 6 is a transmission electron microscope photograph illustrating a bonding interface of Cu/Cu as a junction electrode.

Next, the bonding interlayer 30 will be described in detail. FIG. 5 is a transmission electron microscope photograph illustrating a bonding interface of $SiO_2/SiO_2$ as the insulating layer, and FIG. 6 is a transmission electron microscope photograph illustrating a bonding interface of Cu/Cu as the junction electrode. A transmission electron microscope (TEM) is an electron microscope in which an electron beam is applied to an observation target, and an interference image produced by electrons transmitted through the observation target is enlarged and observed.

As illustrated in FIG. 5, an amorphous silicon (a-Si) layer as the bonding interlayer 30 (an insulating bonded portion 30a) is formed on the bonding interface of $SiO_2/SiO_2$ as the first insulating layer 22 and the second insulating layer 25. In addition, as illustrated in FIG. 6, similarly, an amorphous silicon (a-Si) layer as the bonding interlayer 30 (a conductive bonded portion 30b) is formed on the bonding interface of Cu/Cu as the first bonded electrode 23 and the second bonded electrode 26. Both of the bonding interlayers 30 are formed to have a thickness of approximately 7 nm to 9 nm, and a void (an air gap) does not exist between the bonding interlayer 30 and $SiO_2$ or Cu, and thus, a sufficient adhesion state can be obtained.

The bonding interlayer 30 is formed on the bonded surface of the insulating layer ($SiO_2$) and the bonded electrode (Cu) by sputtering single crystal silicon, and is formed by changing the state from the single crystal silicon to amorphous silicon. The present inventors analyzed a state in the vicinity of the interface by an electron energy-loss spectroscopy (EELS), with respect to two measurement points of a measurement point 1 in the bonding interlayer 30 and a measurement point 2 in the insulating layer ($SiO_2$). The electron energy-loss spectroscopy is a method of analyzing a constituent element or an electronic structure of a substance by measuring the energy lost by a mutual interaction with respect to an atom when electrons are transmitted through a thin sample.

Figure 7:
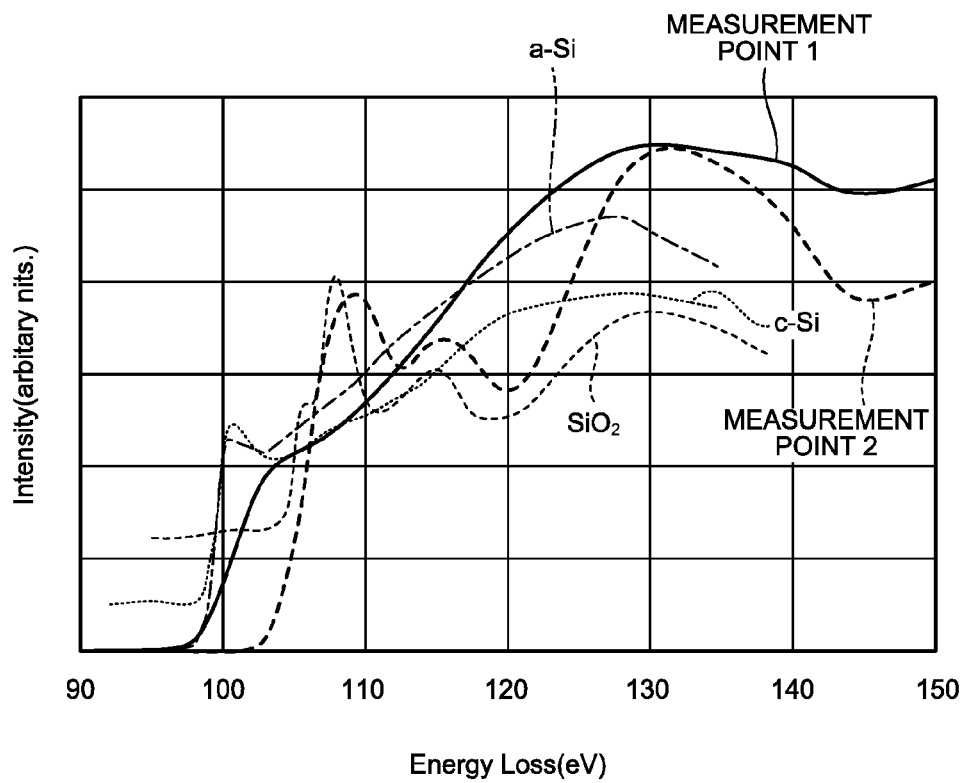
FIG. 7 is a graph illustrating an EELS spectrum of an Si-L absorption edge at a measurement point.
Figure 8:
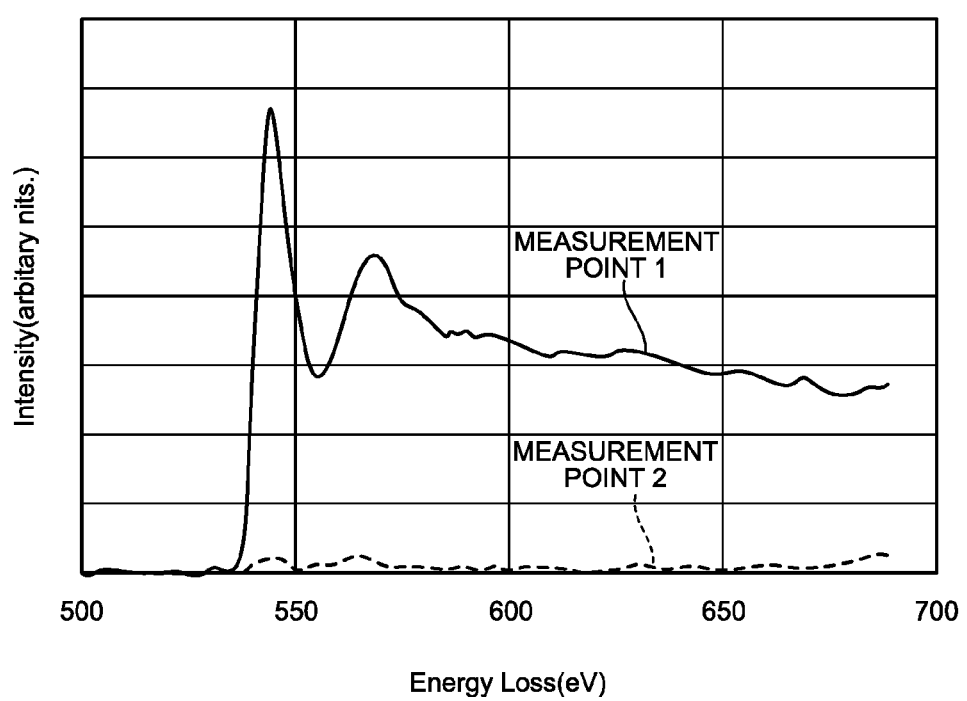
FIG. 8 is a graph illustrating an EELS spectrum of an O—K absorption edge at the measurement point.

FIG. 7 is a graph illustrating an EELS spectrum of an Si-L absorption edge at the measurement point, and FIG. 8 is a graph illustrating an EELS spectrum of an O—K absorption edge at the measurement point. For comparison, FIG. 7 illustrates spectrums in the same energy range of single crystal silicon (c-Si), amorphous silicon (a-Si), and a silicon oxide film ($SiO_2$). As illustrated in FIG. 7, the EELS spectrum of the Si-L absorption edge at the measurement point 1 in the bonding interlayer 30 is close to the single crystal silicon or the amorphous silicon, and a characteristic peak of $SiO_2$ was not observed. In addition, in the EELS spectrum of the O—K absorption edge, the existence of an oxygen atom O was rarely confirmed in the bonding interlayer 30. For this reason, the bonding interlayer 30 does not contain an Si oxide, and the bonding interlayer 30 (the insulating junction portion 30a) formed between the first insulating layer 22 and the second insulating layer 25 is considered as amorphous silicon from a high-resolution image illustrated in FIG. 5.

Figure 9:
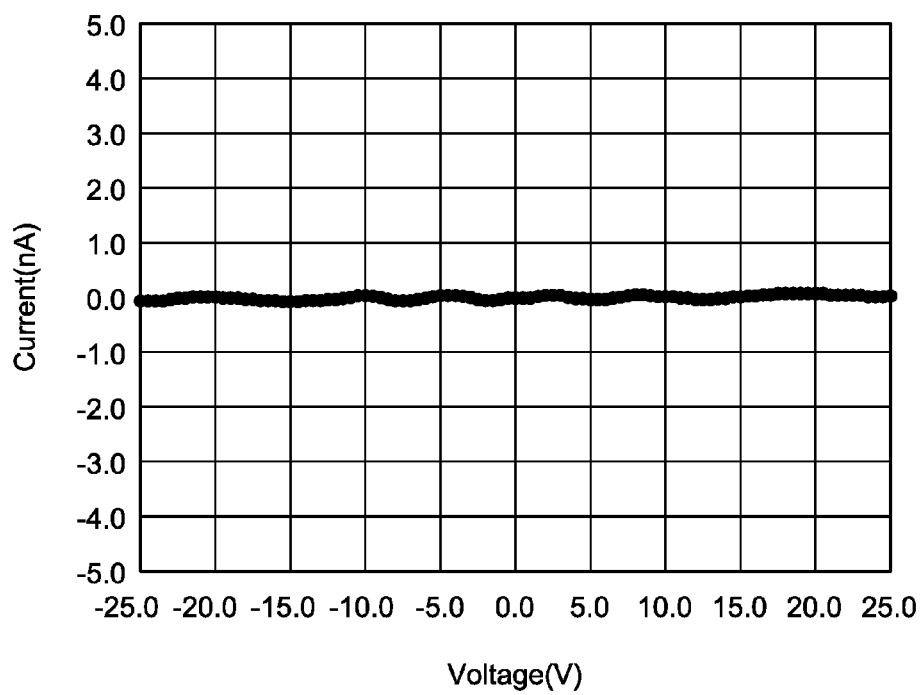
FIG. 9 is a graph illustrating a relationship between a current and a voltage in $SiO_2/SiO_2$ bonding.

Subsequently, the electric properties of the bonding interlayer 30 (the insulating bonded portion 30a) formed in $SiO_2/SiO_2$ were measured. FIG. 9 is a graph illustrating a relationship between a current and a voltage in $SiO_2/SiO_2$. As illustrated in FIG. 9, the electric properties of amorphous silicon are greatly different from those of single crystal silicon, and thus, it is possible to confirm that the amorphous silicon exhibits non-conductivity in which electricity is blocked in the single body. Here, the non-conductivity indicates a state where resistivity is greater than or equal to $10^5$ Ω·cm.

In addition, a bonding strength of $SiO_2/SiO_2$ bonded via the bonding interlayer 30 was measured. The bonding strength is measured by cutting a sample of the bonded $SiO_2/SiO_2$ to be a chip having a size of 12 mm×12 mm, and by performing a tensile test with respect to the chip. In the test, the chip is fixed to a jig, and a load when the chip is broken was measured while changing a tensile load with respect to the jig. In the tensile test, a breakage occurred, but the breakage occurred due to the peeling-off of the chip from the jig on an adhesion interface, and the bonding of $SiO_2/SiO_2$ was retained. The tensile strength at the time of being broken was greater than or equal to 25 MPa, and thus, the strength of the bonding interface due to the bonding interlayer 30 is considered to be greater than or equal to 25 MPa.

Thus, in a configuration using the amorphous silicon (the amorphous semiconductor material) as the junction interlayer 30, a result was obtained in which it is possible to rigidly join the first insulating layer 22 and the second insulating layer 25 together while retaining the non-conductivity (the insulating properties) between the first insulating layer 22 and the second insulating layer 25.

Figure 10:
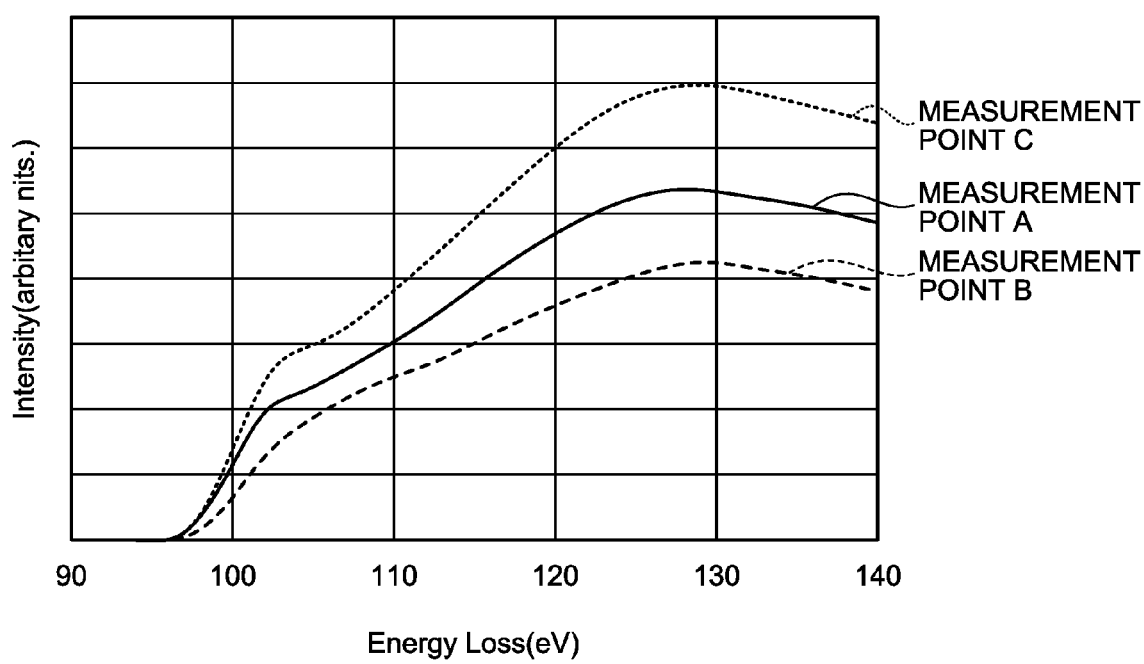
FIG. 10 is a graph illustrating the EELS spectrum of the Si-L absorption edge at the measurement point.
Figure 11:
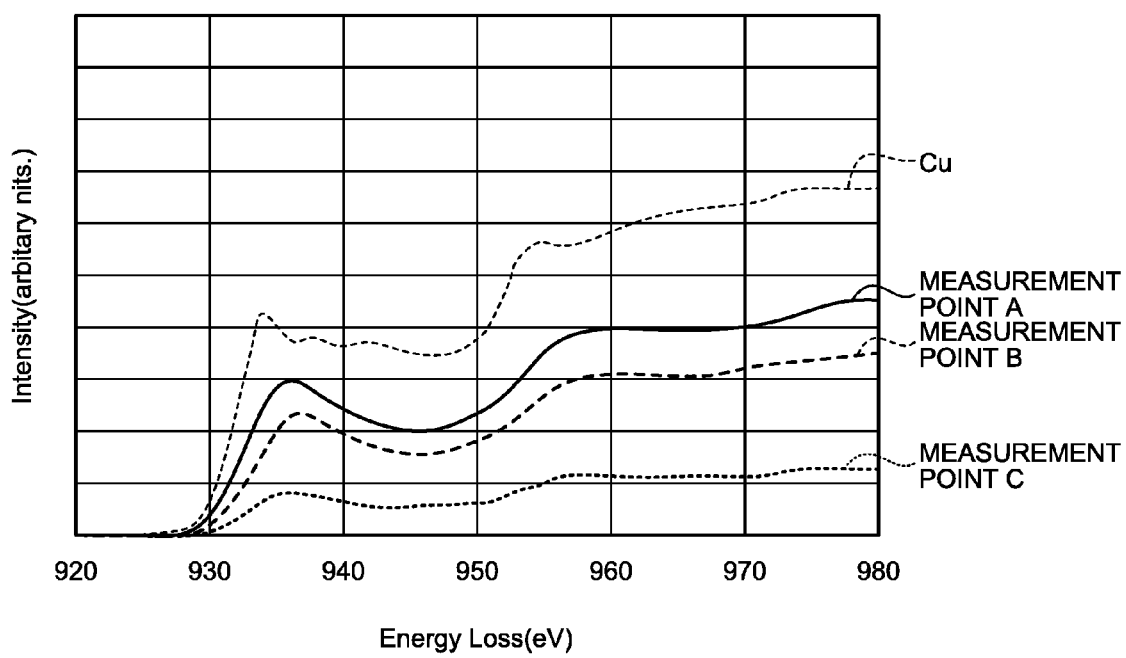
FIG. 11 is a graph illustrating an EELS spectrum of a Cu-L absorption edge at the measurement point.

Next, in the bonding interlayer 30 (the conductive bonded portion 30b) formed in Cu/Cu, a state in the vicinity of the interface was analyzed by an electron energy-loss spectroscopy. There are three measurement points of a measurement point A which is positioned in the vicinity of a boundary between the bonding interlayer 30 and Cu, a measurement point B which is positioned in the center of the bonding interlayer 30 in a thickness direction, and a measurement point C which is positioned between the measurement point A and the measurement point B in the thickness direction. FIG. 10 is a graph illustrating the EELS spectrum of the Si-L absorption edge at the measurement point, and FIG. 11 is a graph illustrating an EELS spectrum of a Cu-L absorption edge at the measurement point. For comparison, FIG. 11 illustrates spectrums in the same energy range of copper (Cu).

As illustrated in FIG. 10, all of the EELS spectrums on the Si-L absorption edge at the measurement points A to C in the bonding interlayer 30 have the same shape, and illustrate that silicon independently exists. In addition, as illustrated in FIG. 11, in the EELS spectrums on the Cu-L absorption edge, the existence of copper is confirmed even at all of the measurement points A to C in the bonding interlayer 30.

Figure 12:
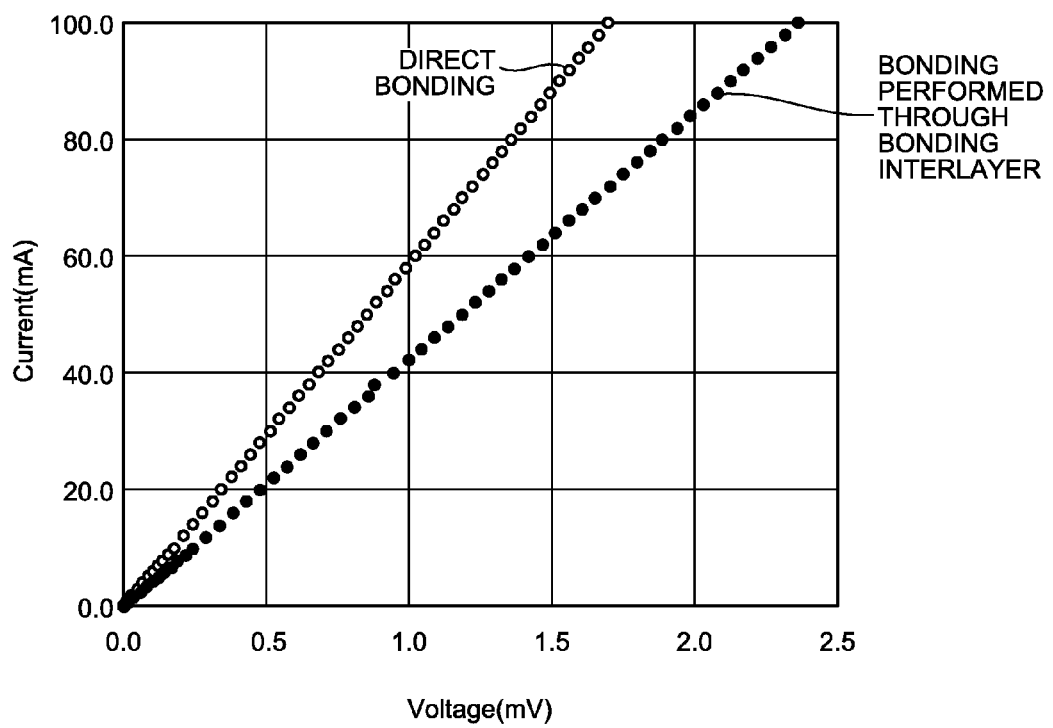
FIG. 12 is a graph illustrating a relationship between a current and a voltage in Cu/Cu bonding.

Further, the electric properties of the bonding interlayer 30 formed in Cu/Cu were measured. FIG. 12 is a graph illustrating a relationship between a current and a voltage in Cu/Cu. As illustrated in FIG. 12, even in a case where the bonding is performed via the bonding interlayer 30, a linear relationship is obtained between the voltage and the current, and thus, ohmic (according to Ohm's Law) connection is considered to be obtained in Cu/Cu. In addition, a resistance value at the time of performing direct bonding in Cu/Cu was less than or equal to 20 (mΩ), and the resistance value at the time of performing the junction via the bonding interlayer 30 was less than or equal to 25 (mΩ), and thus, approximately the same result was obtained. This point is greatly different from the fact that the non-conductivity is exhibited on the bonding interlayer in $SiO_2/SiO_2$. As described above, it is considered that this is because copper exists in the entire region of the bonding interlayer 30 (the conductive bonded portion 30b) even though the amount of copper is partially minute, and it is considered that this is because amorphous silicon of the bonding interlayer 30 and copper of each of the electrodes were bonded to each other at the time of performing pressure-welding between the first bonded electrode 23 and the second bonded electrode 26.

Thus, in a configuration using the amorphous silicon (the amorphous semiconductor material) as the bonding interlayer 30, a result was obtained in which it is possible to ensure the conductivity between the first bonded electrode 23 and the second bonded electrode 26. Accordingly, the semiconductor device 20 of this embodiment includes the bonding interlayer 30 between the front surfaces 17A and 18A to which the bonded electrodes 23 and 26 and the insulating layers 22 and 25 are respectively exposed, and thus, it is possible to realize the hybrid bonding in which the bonded electrodes 23 and 26 and the insulating layers 22 and 25 are respectively and simultaneously bonded together. Further, the bonding interlayer 30 independently exhibits non-conductivity and exhibits conductivity by being bonded to the bonded electrodes 23 and 26, and thus, it is possible to ensure the non-conductivity between the first insulating layer 22 and the second insulating layer 25 while ensuring the conductivity between the first bonded electrode 23 and the second bonded electrode 26. For this reason, it is possible to prevent a current flowing between the first bonded electrode 23 and the second bonded electrode 26 from flowing between the first insulating layer 22 and the second insulating layer 25, and thus, it is possible to prevent a leak current from being generated, and to realize a stable operation of the semiconductor device 20.

Next, a manufacturing procedure of the semiconductor device 20 will be described. FIG. 13A to FIG. 13F are step explanatory diagrams illustrating a step of bonding the first wafer and the second wafer together. As a premise, the first wafer 17 and the second wafer 18 are respectively manufactured in advance according to separate working steps in a state where the bonded electrodes 23 and 26 and the insulating layers 22 and 25 are respectively exposed to the front surfaces 17A and 18A.

Figure 13A:
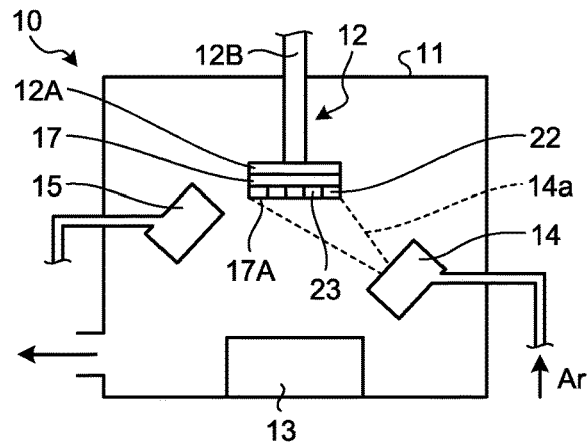
FIG. 13A is a step explanatory diagram illustrating a step of bonding the first wafer and the second wafer together.

As illustrated in FIG. 13A, the first wafer 17 is transported into the vacuum chamber 11 of the bonding at room temperature device 10, and the first wafer 17 is supported on the electrostatic chuck 12A of the upper side stage 12 such that the front surface 17A is directed towards a vertically lower side. A vacuum atmosphere is maintained in the vacuum chamber 11. In this state, an argon beam 14a exits from the fast atom beam source 14 towards the front surface 17A of the first wafer 17. The front surface 17A of the first wafer 17 is irradiated with the argon beam 14a, and the front surface 17A is activated.

Figure 13B:
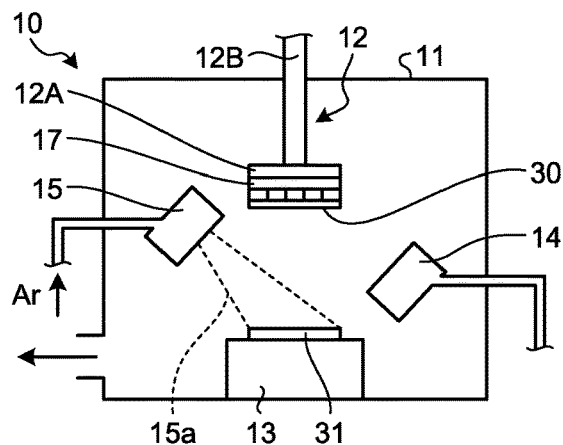
FIG. 13B is a step explanatory diagram illustrating a step of bonding the first wafer and the second wafer together.

Subsequently, as illustrated in FIG. 13B, a bare wafer 31 is transported into the vacuum chamber 11, and the bare wafer 31 is mounted on an upper surface of the lower side stage 13. The bare wafer 31 is formed of single crystal silicon, and is used as a sputtering source at the time of forming the junction interlayer 30. In this state, an argon beam 15a exits from the fast atom beam source 15 towards the bare wafer 31. Accordingly, the bare wafer 31 is sputtered, and a silicon atom flicked out from the bare wafer 31 increases, and thus, the junction interlayer 30 is formed on the front surface 17A of the first wafer 17. In this embodiment, the irradiation of the argon beam 15a is performed for a predetermined time (for example, 10 minutes), and the junction interlayer 30 having a thickness of approximately 1 nm to 50 nm is formed on the front surface 17A of the first wafer 17. As described above, the bonding interlayer 30 is amorphous silicon.

Figure 13C:
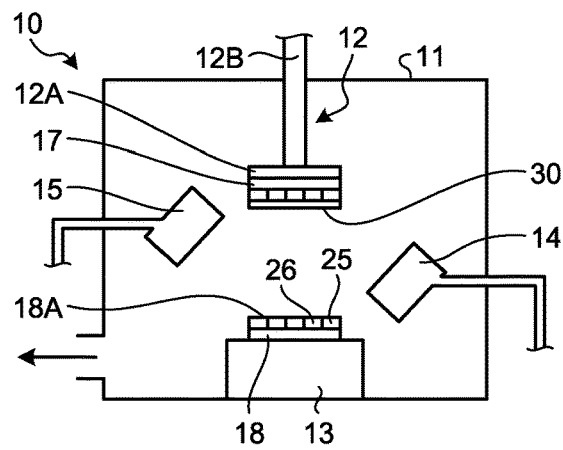
FIG. 13C is a step explanatory diagram illustrating a step of bonding the first wafer and the second wafer together.
Figure 13D:
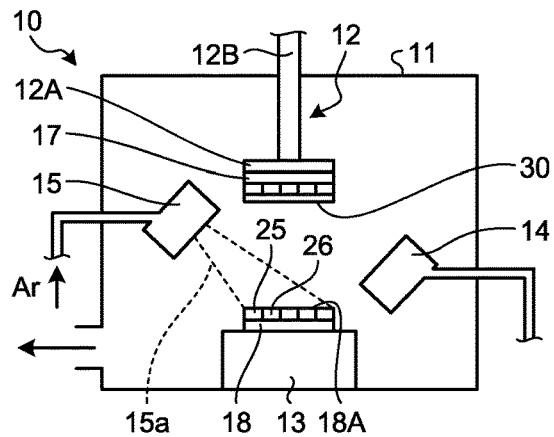
FIG. 13D is a step explanatory diagram illustrating a step of bonding the first wafer and the second wafer together.

Subsequently, as illustrated in FIG. 13C, the bare wafer 31 is discharged from the vacuum chamber 11, and instead, the second wafer 18 is transported into the vacuum chamber 11. The second wafer 18 is mounted on the upper surface of the lower side stage 13 such that the front surface 18A is directed towards a vertically upper side. Subsequently, as illustrated in FIG. 13D, the argon beam 15a exits from the fast atom beam source 15 towards the front surface 18A of the second wafer 18. The front surface 18A of the second wafer 18 is irradiated with the argon beam 15a, and the front surface 18A is activated.

Figure 13E:
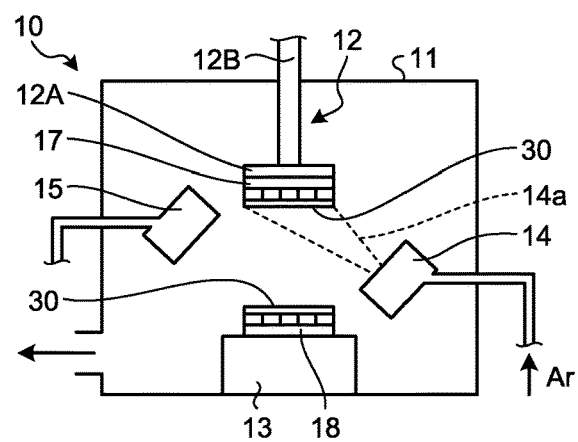
FIG. 13E is a step explanatory diagram illustrating a step of bonding the first wafer and the second wafer together.

Subsequently, as illustrated in FIG. 13E, the argon beam 14a exits from the fast atom beam source 14 towards the bonding interlayer 30 formed on a front surface of the first wafer 17. In this case, a part of the amorphous silicon forming the bonding interlayer 30 functions as a sputtering source. According to the irradiation of the argon beam 14a, the bonding interlayer 30 is sputtered, a silicon atom flicked out from the bonding interlayer 30 increases, and thus, the bonding interlayer 30 is also formed on the front surface 18A of the second wafer 18. In this embodiment, the irradiation of the argon beam 14a is performed for a predetermined time (for example, 10 minutes), and the bonding interlayer 30 having a thickness of approximately 1 nm to 50 nm is formed on the front surface 18A of the second wafer 18. As described above, the bonding interlayer 30 is also amorphous silicon. In this embodiment, the bonding interlayer 30 formed on the front surface of the first wafer 17 is used as the sputtering source, and thus, a separate sputtering source is not required to be prepared for the front surface 18A of the second wafer 18, and the output and input of the sputtering source with respect to the vacuum chamber 11 is reduced, and thus, it is possible to simplify an operating procedure, and to simply form the bonding interlayer 30 on each of the front surfaces 17A and 18A of the first wafer 17 and the second wafer 18.

Figure 13F:
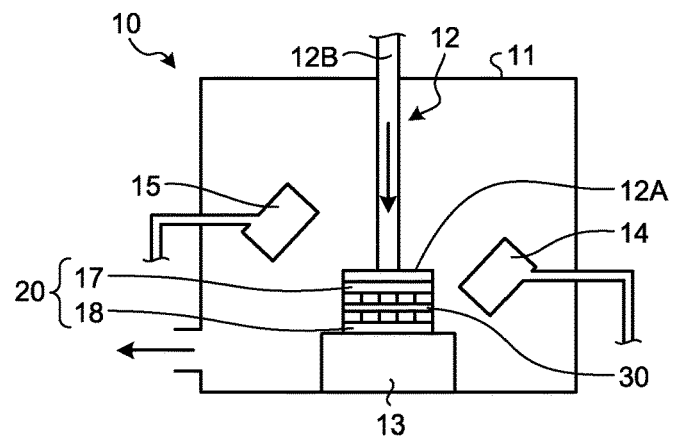
FIG. 13F is a step explanatory diagram illustrating a step of bonding the first wafer and the second wafer together.

Subsequently, the first wafer 17 and the second wafer 18 are aligned, and then, as illustrated in FIG. 13F, the pressure-welding mechanism 12B of the upper side stage 12 is operated, and thus, the electrostatic chuck 12A supporting the first wafer 17 is lowered to a vertically lower side, and the first wafer 17 and the second wafer 18 are subjected to the pressure-welding. Accordingly, the front surface 17A of the first wafer 17 and the front surface 18A of the second wafer 18 are joined together via the junction interlayer 30, and thus, the semiconductor device 20 is formed. Subsequently, the semiconductor device 20 (the first wafer 17 and the second wafer 18) is heated at a predetermined temperature (for example, approximately 50° C. to 400° C.) in the vacuum chamber 11. Accordingly, the alloying of copper (Cu) of the first bonded electrode 23 and the second bonded electrode 26 and amorphous silicon of the bonding interlayer 30 is accelerated, and the bonding between the first bonded electrode 23 and the second bonded electrode 26 becomes more rigid, and thus, the electric properties are improved.

As described above, the manufacturing method of the semiconductor device 20 of this embodiment includes a step of respectively activating the front surface 17A of the first wafer 17 and the front surface 18A of the second wafer 18, a step of forming the bonding interlayer 30 on the activated front surfaces 17A and 18A, and a step of performing the pressure-welding with respect to the first wafer 17 and the second wafer 18 via the bonding interlayer 30, and thus, it is possible to easily realize the hybrid bonding in which the bonded electrodes 23 and 26 and the insulating layers 22 and 25 are respectively and simultaneously bonded together.

Further, in this embodiment, the bare wafer 31 is irradiated with the argon beam 15a, and the bare wafer 31 is sputtered, and thus, the bonding interlayer 30 is formed on the front surface 17A of the first wafer 17, and then, the bonding interlayer 30 formed on the front surface 17A is irradiated with the argon beam 14a, a part of the amorphous silicon forming the bonding interlayer 30 is sputtered, and thus, the bonding interlayer 30 is formed on the front surface 18A of the second wafer 18, and therefore, it is possible to simplify the operating procedure, and to simply form the bonding interlayer 30 on each of the front surfaces 17A and 18A of the first wafer 17 and the second wafer 18.

Next, another manufacturing procedure of the semiconductor device 20 will be described. FIG. 14A to FIG. 14D are step explanatory diagrams illustrating another step of bonding the first wafer and the second wafer together. Even in this case, as a premise, the first wafer 17 and the second wafer 18 are respectively manufactured in advance according to separate working steps in a state where the bonded electrodes 23 and 26 and the insulating layers 22 and 25 are respectively exposed to the front surfaces 17A and 18A.

Figure 14A:
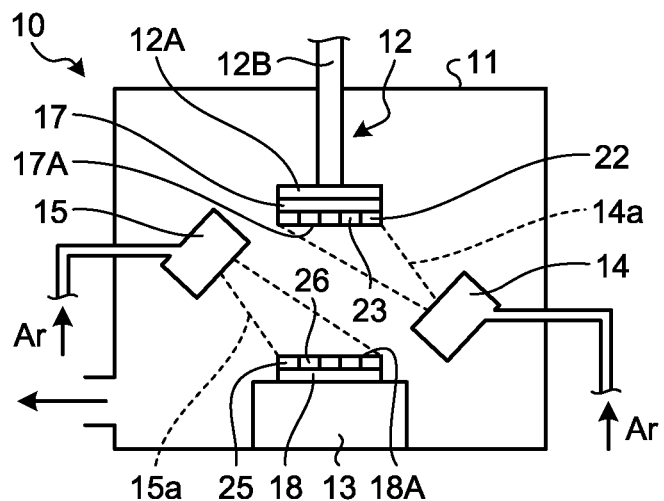
FIG. 14A is a step explanatory diagram illustrating another step of bonding the first wafer and the second wafer together.

As illustrated in FIG. 14A, the first wafer 17 is transported into the vacuum chamber 11 of the bonding at room temperature device 10, and the first wafer 17 is supported on the electrostatic chuck 12A of the upper side stage 12 such that the front surface 17A is directed towards the vertically lower side. Similarly, the second wafer 18 is transported into the vacuum chamber 11, and the second wafer 18 is mounted on the upper surface of the lower side stage 13 such that the front surface 18A is directed towards the vertically upper side. A vacuum atmosphere is maintained in the vacuum chamber 11. In this state, the argon beams 14a and 15a respectively exit from the fast atom beam sources 14 and 15 towards the front surface 17A of the first wafer 17 and the front surface 18A of the second wafer 18. The front surface 17A of the first wafer 17 and the front surface 18A of the second wafer 18 are respectively irradiated with the argon beams 14a and 15a, and the front surfaces 17A and 18A are activated.

Figure 14B:
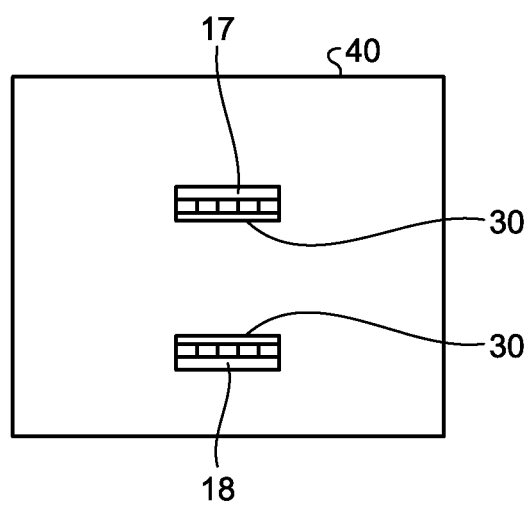
FIG. 14B is a step explanatory diagram illustrating another step of bonding the first wafer and the second wafer together.

Subsequently, as illustrated in FIG. 14B, the first wafer 17 and the second wafer 18 of which the front surfaces 17A and 18A are activated, are transported to a film formation chamber 40 from the vacuum chamber 11. In this case, it is preferable that the first wafer 17 and the second wafer 18 are transported according to a transport path of the vacuum not to be in contact with the outside air (oxygen). The film formation chamber 40 is a chamber for forming the junction interlayer 30 described above on the front surface 17A of the first wafer 17 and the front surface 18A of the second wafer 18, and a chemical vapor deposition device (not illustrated) is disposed in the film formation chamber 40. In a chemical vapor deposition method, raw material gas containing silicon is supplied onto the front surface 17A of the first wafer 17 and the front surface 18A of the second wafer 18 in a state where the first wafer 17 and the second wafer 18 are heated in predetermined conditions, and the bonding interlayer 30 is formed by a chemical reaction on the front surfaces 17A and 18A. Even in the chemical vapor deposition method, the bonding interlayer 30 is formed of amorphous silicon. In such a configuration, it is possible to separately form the bonding interlayer 30, and thus, it is possible to shorten a treatment time of a bonding step.

Figure 14C:
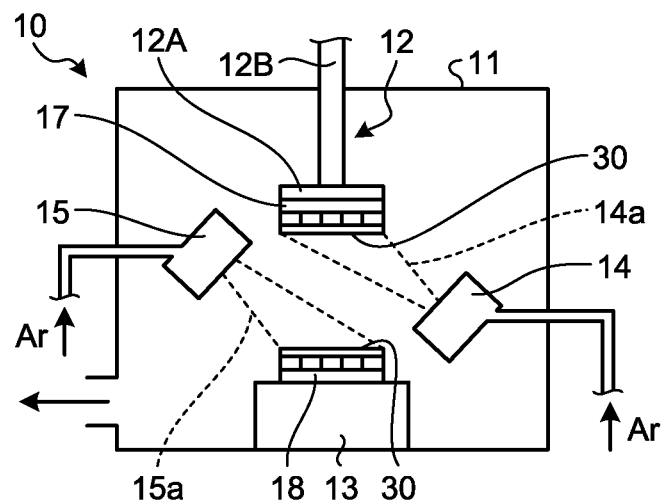
FIG. 14C is a step explanatory diagram illustrating another step of bonding the first wafer and the second wafer together.

Subsequently, as illustrated in FIG. 14C, the first wafer 17 and the second wafer 18 on which the bonding interlayer 30 is formed, are transported into the vacuum chamber 11. Then, the first wafer 17 is supported on the electrostatic chuck 12A of the upper side stage 12 such that the bonding interlayer 30 is directed towards the vertically lower side, and the second wafer 18 is mounted on the upper surface of the lower side stage 13 such that the bonding interlayer 30 is directed towards the vertically upper side. A vacuum atmosphere is maintained in the vacuum chamber 11. In this state, the argon beams 14a and 15a respectively exit from the fast atom beam sources 14 and 15 towards the bonding interlayers 30 and 30 formed on the first wafer 17 and the second wafer 18. Front surfaces of the junction interlayers 30 and 30 of the first wafer 17 and the second wafer 18 are irradiated with the argon beams 14a and 15a, and the front surfaces of the bonding interlayers 30 and 30 are activated.

Figure 14D:
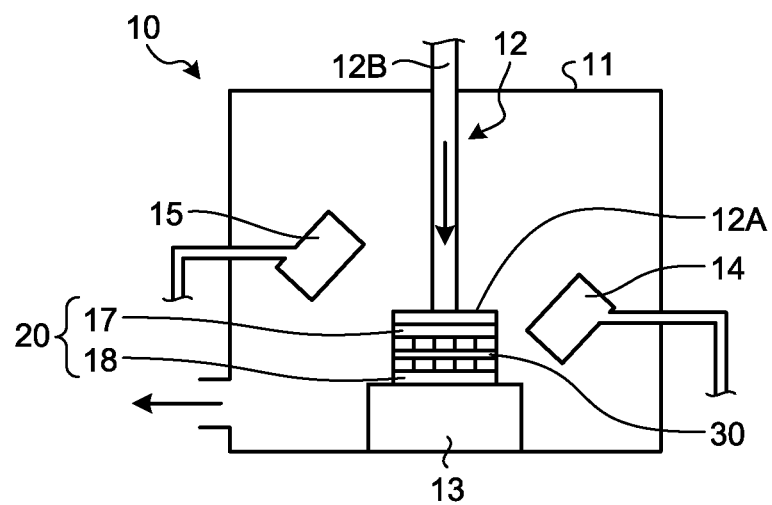
FIG. 14D is a step explanatory diagram illustrating another step of bonding the first wafer and the second wafer together.

Subsequently, the first wafer 17 and the second wafer 18 are aligned, and then, as illustrated in FIG. 14D, pressure-welding mechanism 12B of the upper side stage 12 is operated, and thus, the electrostatic chuck 12A supporting the first wafer 17 is lowered to the vertically lower side, and the first wafer 17 and the second wafer 18 are subjected to the pressure-welding. Accordingly, the front surface 17A of the first wafer 17 and the front surface 18A of the second wafer 18 are bonded together via the bonding interlayer 30, and thus, the semiconductor device 20 is formed. Subsequently, the semiconductor device 20 (the first wafer 17 and the second wafer 18) is heated at a predetermined temperature (for example, 50° C. to 400° C.) in the vacuum chamber 11. Accordingly, the alloying of copper Cu of the first bonded electrode 23 and the second bonded electrode 26 and amorphous silicon of the bonding interlayer 30 is accelerated, and the bonding between the first bonded electrode 23 and the second bonded electrode 26 becomes more rigid, and thus, the electric properties are improved.

Figure 15A:
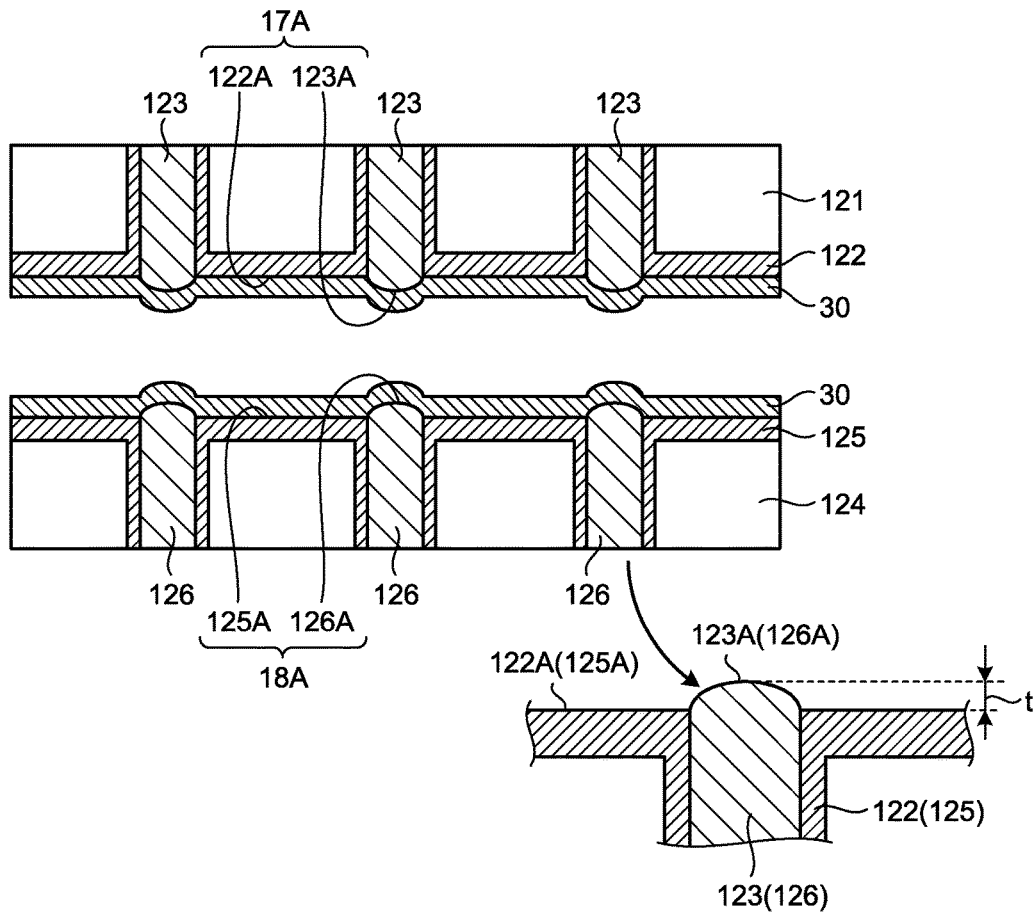
FIG. 15A is a sectional view schematically illustrating a configuration before a first wafer and a second wafer according to another embodiment are bonded together.
Figure 15B:
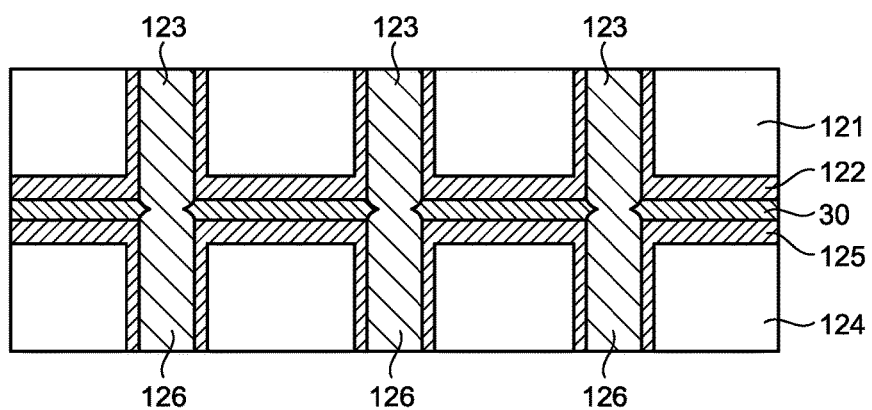
FIG. 15B is a sectional view schematically illustrating a configuration of a state where the first wafer and the second wafer according to another embodiment are bonded together.

Next, another embodiment will be described. FIG. 15A is a sectional view schematically illustrating a configuration before a first wafer and a second wafer according to another embodiment are bonded together, and FIG. 15B is a sectional view schematically illustrating a configuration of a state where the first wafer and the second wafer according to another embodiment are bonded together. In the configuration described above, the front surface 17A of the first wafer 17 and the front surface 18A of the second wafer 18 are respectively formed as a flat surface, and the front surfaces 17A and 18A are formed to be closely bonded together. In contrast, in another embodiment, as illustrated in FIG. 15A, a first insulating layer 122 and a first bonded electrode 123 laminated on a first semiconductor base material 121 are exposed to the front surface 17A, a height position of a front surface 122A of the first insulating layer 122 is lower than a height position of a front surface 123A of the first bonded electrode 123. A difference t between the height positions is set to be approximately 1 nm to 100 nm, which is approximately the same level as the bonding interlayer 30. Similarly, a second insulating layer 125 and a second bonded electrode 126 laminated on a second semiconductor base material 124 are exposed to the front surface 18A, and a height position of a front surface 125A of the second insulating layer 125 is lower than a height position of a front surface 126A of the second bonded electrode 126. A difference t between the height positions is set to be approximately 1 nm to 100 nm, which is approximately the same level as the bonding interlayer 30. The other configurations are identical to the configurations of the embodiment described above, and thus, the description thereof will be omitted.

According to such a configuration, when the first wafer 17 and the second wafer 18 are subjected to the pressure-welding, a pressure-welding load is imparted to the first bonded electrode 123 and the second bonded electrode 126, and as illustrated in FIG. 15B, the bonding interlayer 30 is broken by the first bonded electrode 123 and the second bonded electrode 126, and the first bonded electrode 123 and the second bonded electrode 126 are directly bonded together. Accordingly, excellent electric properties and excellent junction strength can be obtained in the bonding between the first bonded electrode 123 and the second bonded electrode 126.

As described above, the embodiments of the present invention have been described, but the present invention is not limited to the embodiments described above. For example, in the embodiments described above, although the bonding interlayer 30 is formed on both of the front surfaces 17A and 18A of the first wafer 17 and the second wafer 18, it may be formed on one of the front surfaces 17A and 18A. In addition, in the embodiments described above, although the first bonded electrode 123 and the second bonded electrode 126 are respectively formed to protrude from the first insulating layer 122 and the second insulating layer 125, one of the first bonded electrode 123 and the second bonded electrode 126 may be formed to protrude from the first insulating layer 122 and the second insulating layer 125. In addition, in the embodiments described above, a configuration has been described in which the bonding interlayer 30 is formed by the sputtering or the chemical vapor deposition method, and the bonding interlayer 30 may be formed by vapor deposition. In the vapor deposition, a vapor deposition material (for example, silicon) is heated in a vacuum container, is gasified or sublimated, and is attached onto a front surface of a substrate mounted in a separated position, and thus, a thin film is formed. According to such a method, the bonding interlayer 30 is formed of amorphous silicon. In such a configuration, it is possible to separately form the bonding interlayer 30, and thus, to shorten the treatment times of the bonding step.

REFERENCE SIGNS LIST

10 BONDING AT ROOM TEMPERATURE DEVICE
11 VACUUM CHAMBER
12 UPPER SIDE STAGE
12A ELECTROSTATIC CHUCK
12B PRESSURE-WELDING MECHANISM
13 LOWER SIDE STAGE
14, 15 FAST ATOM BEAM SOURCE
14a, 15a ARGON BEAM
17 FIRST WAFER (SUBSTRATE)
17A FRONT SURFACE (BONDED SURFACE)
18 SECOND WAFER (SUBSTRATE)
18A FRONT SURFACE (BONDED SURFACE)
20 SEMICONDUCTOR DEVICE
21, 121 FIRST SEMICONDUCTOR BASE MATERIAL
22, 122 FIRST INSULATING LAYER (INSULATING MATERIAL)
23, 123 FIRST BONDED ELECTRODE (CONDUCTIVE MATERIAL)
24, 124 SECOND SEMICONDUCTOR BASE MATERIAL
25, 125 SECOND INSULATING LAYER (INSULATING MATERIAL)
26, 126 SECOND BONDED ELECTRODE (CONDUCTIVE MATERIAL)
30 BONDING INTERLAYER
31 BARE WAFER
40 FILM FORMATION CHAMBER
122A FRONT SURFACE
123A FRONT SURFACE
125A FRONT SURFACE
126A FRONT SURFACE

The invention claimed is:

1. A room-temperature-bonding semiconductor device, comprising:
one substrate with semiconductor base materials including conductive materials and insulating materials in a surface thereof as a bonded surface;
another substrate with semiconductor base materials including conductive materials and insulating materials in a surface thereof as a bonded surface; and
a bonding interlayer which is disposed between the one substrate and the another substrate in contact with the entire bonded surface of the one substrate and the entire bonded surface of the another substrate and which has portions with conductivity by contact with the conductive materials of the one substrate and the another substrate which ensure the conductivity between the conductive materials of the one substrate and the conductive materials of the another substrate and portions with non-conductivity in contact with the insulating materials of the one substrate and the another substrate.

2. The room-temperature-bonded semiconductor device according to claim 1,
wherein the insulating materials of the one substrate and the insulating materials of the another substrate are bonded together via the bonding interlayer.

3. The room-temperature-bonded semiconductor device according to claim 1,
wherein the bonding interlayer is formed of an amorphous semiconductor material.

4. The room-temperature bonded semiconductor device according to claim 1,
wherein at least one of the one substrate and the another substrate is formed such that the conductive materials are formed to be protruded in a direction perpendicular to the bonding interlayer to the bonding interlayer compared to the insulating materials a height position of the insulating material of the bonded surface is lower than that of the conductive material.

5. A manufacturing method of a room-temperature-bonded semiconductor device including, comprising:
one substrate with semiconductor base materials including conductive materials and insulating materials being formed in a surface thereof as a bonded surface;
another substrate with semiconductor base materials including conductive materials and insulating materials being formed in a surface thereof as a bonded surface; and
a bonding interlayer which is disposed between the one substrate and the another substrate in contact with the entire bonded surface of the one substrate and the entire bonded surface of the another substrate, one surface thereof being bonded to the bonded surface of the one substrate and another surface thereof being bonded to the bonded surface of the another substrate, and which has portions with conductivity obtained by the contact with the conductive materials of the one substrate and the another substrate bonded thereto and portions with non-conductivity bonded to the insulating materials of the one substrate and the another substrate, the method comprising the steps of:
respectively activating the bonded surfaces of the substrates;
after the activating step, forming a bonding interlayer which independently exhibits non-conductivity and exhibits conductivity by being bonded to the conductive material, on at least one of the activated bonded surfaces; and
after the forming step, performing pressure-welding with respect the one substrate and the another substrate via the bonding interlayer,
wherein, in the forming step, a semiconductor material is sputtered by being irradiated with a fast atom beam, and thus, the bonding interlayer is formed on the bonded surface of the one substrate, and then, the bonding interlayer formed on the bonded surface is irradiated with a fast atom beam, and a part of the semiconductor material forming the bonding interlayer is sputtered, and thus, the bonding interlayer is formed on the bonded surface of the another substrate.

6. A manufacturing method of a room-temperature-bonded semiconductor device including one substrate with semiconductor base materials including conductive materials and insulating materials being formed in a surface thereof as a bonded surface;

another substrate with semiconductor base materials including conductive materials and insulating materials being formed in a surface thereof as a bonded surface; and a bonding interlayer which is disposed between the one substrate and the another substrate in contact with the entire bonded surface of the one substrate and the entire bonded surface of the another substrate, one surface thereof being bonded to the bonded surface of the one substrate and another surface thereof being bonded to the bonded surface of the another substrate, and which has portions with conductivity obtained by the contact with the conductive materials of the one substrate and the another substrate bonded thereto and portions with non-conductivity bonded to the insulating materials of the one substrate and the another substrate, the method comprising the steps of:

respectively activating the bonded surfaces of the substrates;

after the activating step, forming a bonding interlayer which independently exhibits non-conductivity and exhibits conductivity by being bonded to the conductive material, on at least one of the activated bonded surfaces; and after the forming step, performing pressure-welding with respect to the one substrate and the another substrate via the bonding interlayer, wherein at least one of the one substrate and the another substrate is formed such that a height position of the insulating material of the bonded surface is lower than that of the conductive material, a pressure-welding load is imparted to the conductive material at the time of performing pressure welding with respect to the substrates, the conductive materials are directly bonded together and thus, the bonding interlayer is broken by the conductive material.

7. The manufacturing method of a room-temperature-bonded semiconductor device according to claim 5, further comprising a step of:

after the pressure-welding step, heating the one substrate and the another substrate at a predetermined temperature.

8. The manufacturing method of a room-temperature-bonded semiconductor device according to claim 5, wherein the bonding interlayer is formed by vapor deposition, sputtering, or chemical vapor deposition of the semiconductor material.

9. The manufacturing method of a room-temperature-bonded semiconductor device according to claim 5, wherein at least one substrate and the another substrate is formed such that a height position of the insulating material of the bonded surface is lower than that of the conductive material, and a pressure-welding load is imparted to the conductive material at the time of performing pressure-welding with respect to the substrates, the conductive material are directly bonded together and thus, the bonding interlayer is broken by the conductive material.

* * * * *